(12) United States Patent
Grewing

(10) Patent No.: US 10,284,214 B2
(45) Date of Patent: May 7, 2019

(54) FILTER CIRCUIT FOR FILTERING AN INPUT SIGNAL OF AN ANALOGUE-TO-DIGITAL CONVERTER

(71) Applicant: Forschungszentrum Jülich GmbH, Jülich (DE)

(72) Inventor: Christian Grewing, Jülich (DE)

(73) Assignee: FORSCHUNGSZENTRUM JÜLICH GmbH (DE)

( * ) Notice: Subject to any disclaimer, the term of this patent is extended or adjusted under 35 U.S.C. 154(b) by 0 days.

(21) Appl. No.: 15/743,123

(22) PCT Filed: Jul. 5, 2016

(86) PCT No.: PCT/EP2016/065856
§ 371 (c)(1),
(2) Date: Jan. 9, 2018

(87) PCT Pub. No.: WO2017/005745
PCT Pub. Date: Jan. 12, 2017

(65) Prior Publication Data
US 2018/0351566 A1    Dec. 6, 2018

(30) Foreign Application Priority Data
Jul. 9, 2015 (DE) .................. 10 2015 212 848

(51) Int. Cl.
  *H03M 1/06* (2006.01)
  *H03M 1/08* (2006.01)
  *H03M 1/36* (2006.01)

(52) U.S. Cl.
  CPC ....... *H03M 1/0863* (2013.01); *H03M 1/0626* (2013.01); *H03M 1/361* (2013.01)

(58) Field of Classification Search
  CPC ... H03M 1/0863; H03M 1/0626; H03M 1/361
  (Continued)

(56) References Cited

U.S. PATENT DOCUMENTS 5,680,265 A   10/1997  Noguchi
5,990,707 A *  11/1999  Goldenberg .......... H03M 1/362
                                                    327/57

(Continued)

FOREIGN PATENT DOCUMENTS

WO    9913583 A1    3/1999

OTHER PUBLICATIONS

International Search Report for corresponding International Application No. PCT/EP2016/065856 dated Sep. 28, 2016.

(Continued)

*Primary Examiner* — Khai M Nguyen
(74) *Attorney, Agent, or Firm* — Tarolli, Sundheim, Covell & Tummino LLP

(57) ABSTRACT

The invention relates to a filter circuit (200) comprising at least a first filter line (210). The first filter line (210) has a first input circuit (10), a first integration circuit (20) and a first output circuit (30). The first input circuit (10) is configured in such a way that, as a function of the value of the input signal, it converts an input signal into at least two distinguishable, first first-stage output signals and relays the first-stage output signals to the first integration circuit (20, 240) during a prescribed period of time. The first integration circuit (20) is configured to integrate the first first-stage output signals of the first input circuit (10) over the prescribed period of time and to generate a first integration signal (25). The first output circuit (25) is configured to compare the first integration signal (25) to a first output reference value and to generate a first second-stage output signal (35). The invention also relates to an appertaining filtering method.

12 Claims, 6 Drawing Sheets

(58) Field of Classification Search
USPC .................................................. 341/143, 155
See application file for complete search history.

(56) References Cited

U.S. PATENT DOCUMENTS 5,990,814 A * 11/1999 Croman ............... H03K 5/2481
341/118
2010/0214147 A1    8/2010 Koyama

OTHER PUBLICATIONS

International Preliminary Report on Patentability for corresponding International Application No. PCT/EP2016/065856 dated Jun. 16, 2017, and English translation.
Communication for corresponding German patent application No. 102015212848.2, dated Jun. 21, 2016.

* cited by examiner

FILTER CIRCUIT FOR FILTERING AN INPUT SIGNAL OF AN ANALOGUE-TO-DIGITAL CONVERTER

RELATED APPLICATIONS

The present invention is a U.S. National Stage under 35 USC 371 patent application, claiming priority to Serial No. PCT/EP2016/065856, filed on 5 Jul. 2016; which claims priority of DE 10 2015 212 848.2, filed on 9 Jul. 2015, the entirety of both of which are incorporated herein by reference.

FIELD OF THE INVENTION

The invention relates to a filter circuit for filtering an input signal of an analog-to-digital converter, it also relates to an analog-to-digital converter as well as to an appertaining method for filtering an input signal of an analog-to-digital converter.

BACKGROUND OF THE INVENTION

An analog-to-digital converter (ADC) is supposed to decide at a given recurring point in time whether the input signal is above or below a given threshold. A plurality of thresholds then yields a digital representation of the signal at a certain point in time of the clocking period. In the case of a conventional ADC, the input signal has to be filtered (anti-aliasing filter) prior to the conversion. In this process, noise or non-linearities can interfere with the input signal. An active filter consumes additional energy. In order to avoid a fluctuation of the point in time of the detection, efforts are also aimed at generating edges that are as sharp as possible for the clock signal. Due to parasitic coupling, such edges cause interferences in the internal signals of the ADC, in other words, for example, also in the reference voltages with which the input signal is compared. These fluctuations give rise to erroneous decisions by the comparators.

In this context, International patent document WO 99/13583 discloses a system and a method for correcting a comparator offset that occurs during the operation of an analog-to-digital converter.

SUMMARY OF THE INVENTION

It is an objective of the present invention to put forward an improved filter circuit, especially for filtering an input signal of an analog-to-digital converter.

According to a first aspect of the invention, a filter circuit for filtering an input signal, especially an analog input signal, is being put forward. The filter circuit comprises at least a first filter line. The first filter line has a first input circuit, a first integration circuit and a first output circuit. The first input circuit is configured in such a way that, as a function of the value of the input signal, it converts an analog input signal into at least two distinguishable, first first-stage output signals and relays the first-stage output signals to the first integration circuit during a prescribed period of time. The first integration circuit is also configured to integrate the first first-stage output signals of the first input circuit over the prescribed period of time and to generate a first integration signal. The first output circuit is configured to compare the first integration signal to a first output reference value and to generate a first second-stage output signal.

The integration prevents changes to the input signal—especially high-frequency interferences in the input signal that are shorter than the prescribed period of time—from having little or no influence on the integration result. In this context, the first first-stage output signals are of a discrete nature. An example of discrete first first-stage output signals would be the defined voltages at the output of a comparator that compares whether the input signal is above or below a defined reference voltage. The first first-stage output signals can be emitted continuously or at discrete time intervals.

The first filter line has a first input reference value. In this context, the first input reference value can be fixed or freely programmable. The input signal is compared to the first input reference value in order to determine the first first-stage output signals.

The input signal is converted by the input circuit into first first-stage output signals which, in this embodiment, set the input signal at a defined relation to the defined first input reference value. In this embodiment, the aim of this referencing of the input signal is to render the first first-stage output signals distinguishable through the relation to the defined first input reference value. The first first-stage output signals correspond to the mathematical sign of the input signal minus the first input reference value. The first input reference value has a discrete value.

The first input circuit preferably comprises at least an input comparator and the first output circuit preferably comprises at least an output comparator.

The first integration circuit preferably has at least a first capacitor and first switches. In this embodiment, the first capacitor and the first switches are configured so that, over the prescribed period of time, they accumulate electric charges that are associated with the first first-stage output signals. The first switches are switched in such a way that, for example, during the prescribed period of time, charges flow to the first capacitor due to the first first-stage output signals. At the end of the prescribed period of time, the first switches are switched in such a way that the charge accumulated during the prescribed period of time can be relayed to the first capacitor as an integration signal or else it can be made available to the output circuit. Once the integration signal has been relayed to the output circuit, the first switches are switched in such a way that the first capacitor is discharged. In a subsequent prescribed period of time, the first capacitor can be recharged so as to make an integration signal available once again.

The prescribed period of time is preferably prescribed by a first regular time signal. The first regular time signal can be, for instance, a periodic clock signal within a circuit arrangement. This clock signal can have, for example, a rectangular shape, whereby at least a half-period of the clock signal is employed to generate the integration signal.

The first filter line preferably has a first circuit for the time discretization. In this process, the first circuit for the time discretization is configured to process the first second-stage output signal and to convert it into a time-discrete output signal. Examples of circuits for the time discretization are clocked flip-flops or latches. The first circuit for the time discretization is preferably configured to convert the first second-stage output signal into the first time-discrete output signal as a function of the first, regular, especially periodic, time signal.

The filter circuit preferably comprises at least a second filter line, whereby a first range of the input signal is associated with the first filter line, and a second range of the input signal is associated with the second filter line, whereby the first range of the input signal differs from the second range of the input signal.

The first and second ranges can partially overlap. The second filter line encompasses a second input circuit, a second integration circuit and a second output circuit. The second input circuit generates a second first-stage output signal. The integration circuit generates a second integration signal. The output circuit generates a second second-stage output signal. The first filter line is thus configured to filter the first range of the input signal in the manner described above. The second filter line is thus configured to filter the second range of the input signal in the manner described above.

The filter circuit preferably comprises at least a third filter line, whereby a third range of the input signal is associated with the third filter line, whereby the second range of the input signal adjoins the first range of the input signal, and the third range of the input signal adjoins the second range of the input signal. The third filter line comprises a third input circuit, a third integration circuit and a third output circuit. The third input circuit generates a third first-stage output signal. The integration circuit generates a third integration signal. The third output circuit generates a third second-stage output signal. The third filter line is thus configured to filter the third range of the input signal in the manner described above. The filter circuit can have additional filter lines (4, 5, 6 or more) so that, by means of the filter lines, a plurality of second-stage output signals or time-discrete output signals can be assigned to the input signal.

The first range, the second range, the third range and other ranges of the input signal are preferably of the same magnitude. In this manner, the input signal can be divided into a plurality of ranges of the same magnitude for which the second-stage output signals or time-discrete output signals are determined by means of the individual filter lines of the filter circuit.

The first filter line preferably has a first input reference value, the second filter line has a second reference value and the third filter line has a third reference value. The first range is associated by means of the first input reference value. The second range is associated by means of the second input reference value. The third range is associated by means of the third input reference value.

In a preferred embodiment, a thermometer code is generated by means of the first second-stage output signal, by means of a second second-stage output signal generated by the second filter line, and by means of a third second-stage output signal generated by the third filter line. The time-discrete output signal is preferably a time-discrete thermometer code.

It is another objective of the present invention to put forward an improved analog-to-digital converter.

The analog-to-digital converter preferably comprises a filter circuit that generates a time-discrete thermometer code in the manner described above. The analog-to-digital converter also comprises a transformation unit, whereby the transformation unit is configured to convert the time-discrete thermometer code into a time-discrete binary output signal.

It is another objective of the present invention to put forward an improved method for filtering signals. The method encompasses the following steps:

as a function of the value of the input signal, an input signal is converted into at least two distinguishable first first-stage output signals, whereby the input signal is compared to a first input reference value in order to determine the first first-stage output signals, whereby the first first-stage output signals correspond to the mathematical sign of the input signal minus the first input reference value;

the first first-stage output signals are integrated over a prescribed period of time;

a first integration signal is generated on the basis of the result of the integration;

the first integration signal is compared to a first output reference value; and a first second-stage output signal is generated on the basis of the result of the comparison.

The individual steps of the method do not necessarily have to be carried out in the sequence indicated above.

It is pointed out that the filter circuits, the analog-to-digital converters, and the methods described herein have similar and/or identical configurations, especially as these are recited in the claims.

It is also pointed out that every combination of the dependent claims with the corresponding independent claims also constitutes a preferred embodiment of the invention.

Additional preferred embodiments are described below.

BRIEF DESCRIPTION OF THE FIGURES

These and other aspects of the invention are shown in detail in the figures as follows.

DETAILED DESCRIPTION OF THE EMBODIMENTS

Figure 1:
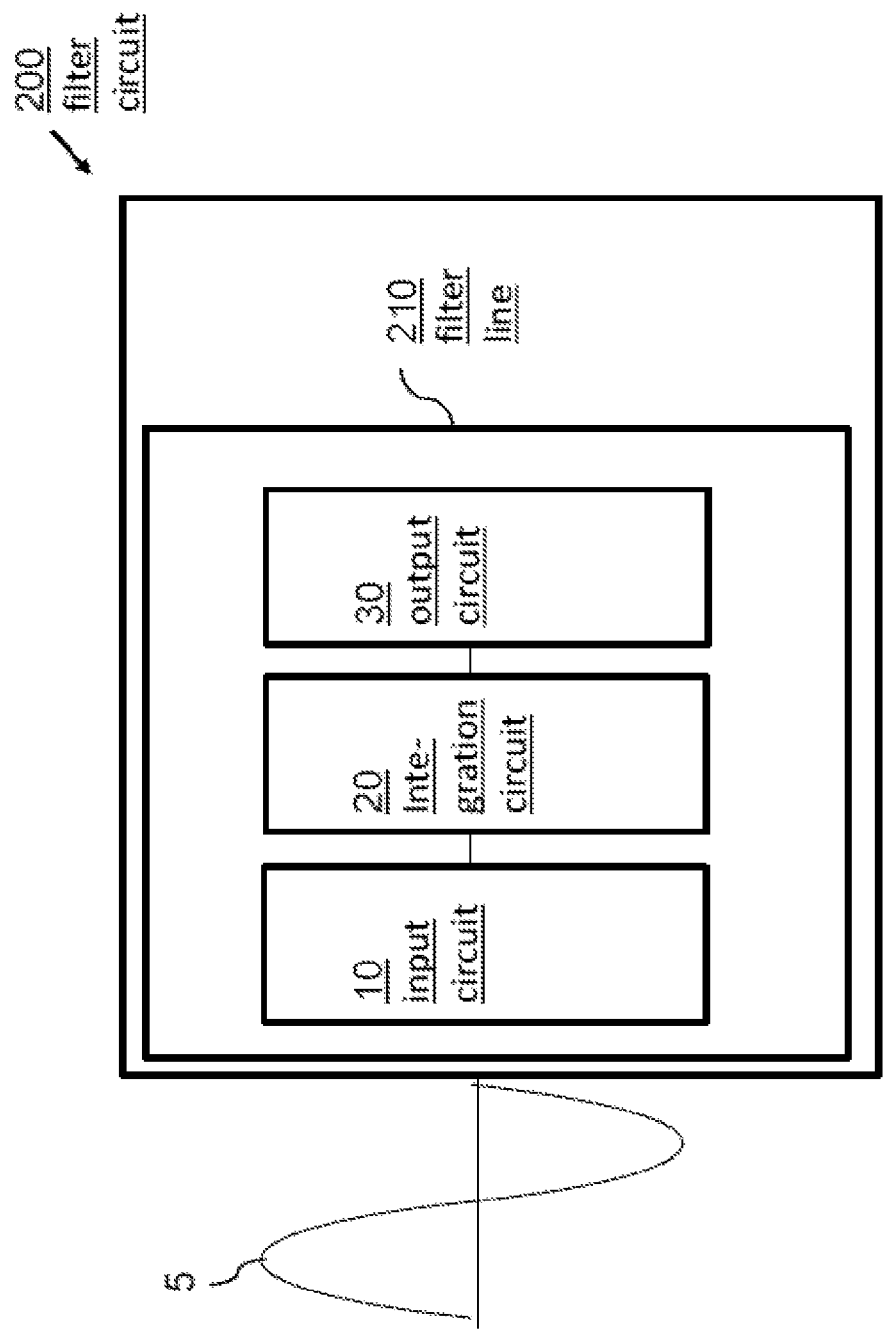
FIG. 1 shows a schematic diagram of a first filter circuit.

FIG. 1 shows a schematic diagram of a first filter circuit 200. The filter circuit 200 comprises a filter line 210 with an input circuit 10, an integration circuit 20 and an output circuit 30. The input circuit 10 converts an analog input signal 5 into first first-stage output signals which set the input signal 5 at a defined relation, for instance, to a defined input reference value 11, 12, 13, 14. The aim of this referencing of the input signal 5 is to render the first first-stage output signals distinguishable by means of the relation to the defined input reference value 11, 12, 13, 14. In this embodiment, this distinguishability due to the referencing permits an integration of the first first-stage output signals over a prescribed period of time, so that the result of the integration has an unambiguous value. The integration prevents changes to the input signal 5—particularly high-frequency interferences in the input signal 5 that are shorter than the prescribed period of time—from having little or no influence on the integration result. In this context, the first first-stage output signals can be of a discrete nature or else they can be a steady image of the input signal 5 that is referenced by means of the input reference value 11, 12, 13, 14 or reference signal. An example of discrete first first-stage output signals would be the defined voltages at the output of a comparator that compares whether the input signal 5 is above or below a defined reference voltage. The first first-stage output signals can be emitted continuously or at discrete time intervals. In the case of a time-discrete emission of the first first-stage output signals, it must be ensured that several multi-stage output signals (preferably at least three) are generated over the prescribed period of time. The integration circuit 20 receives the first first-stage output signals and integrates them over the prescribed period of time. In this context, the integration can be carried out in a digital or analog manner. In the case of a digital integration, for instance, the number of time-discrete first-stage output signals at a higher voltage and at a lower voltage (for example, at the output of a comparator) during the prescribed period of time can be determined and then subtracted from each other. In the case of an analog integration, for instance, a voltage could be determined which results from a charge shift to one or more capacitors, said shift having been caused by the one-stage output signals. The analog integration could have the advantage that it is less sensitive to brief interferences in the input signal 5. Moreover, the digital integration would necessitate a high clocking of the first first-stage output signals in order to carry out a reliable integration within the prescribed period of time. The integration circuit 20 generates a first integration signal 25 on the basis of the integration of the first first-stage output signals and relays the first integration signal 25 to the output circuit 30. The output circuit 30 compares the first integration signal 25 to a first output reference value and generates a first second-stage output signal 35.

Such a filter circuit 200 could be used especially in analog-to-digital converters. In contrast to conventional analog-to-digital converters, the analog signal would not be converted into a digital signal at a single point in time, whereby this point in time would be prescribed, for example, by the edge of a clock signal. Rather, the analog signal would be integrated over a prescribed period of time that could correspond, for instance, to a half-period of the clock signal. The integration signal would then be employed to generate the digital signal. This would entail the advantage that brief fluctuations or interferences in the input signal 5 that are shorter than a half-period of the clock signal would have a considerably diminished influence on the result of the digitization. The brief fluctuations or interferences in the input signal 5 are preferably shorter than half, one-third, one-fifth or, for example, one-tenth, of the prescribed period of time (in this case, a half-period of the clock signal).

Figure 2:
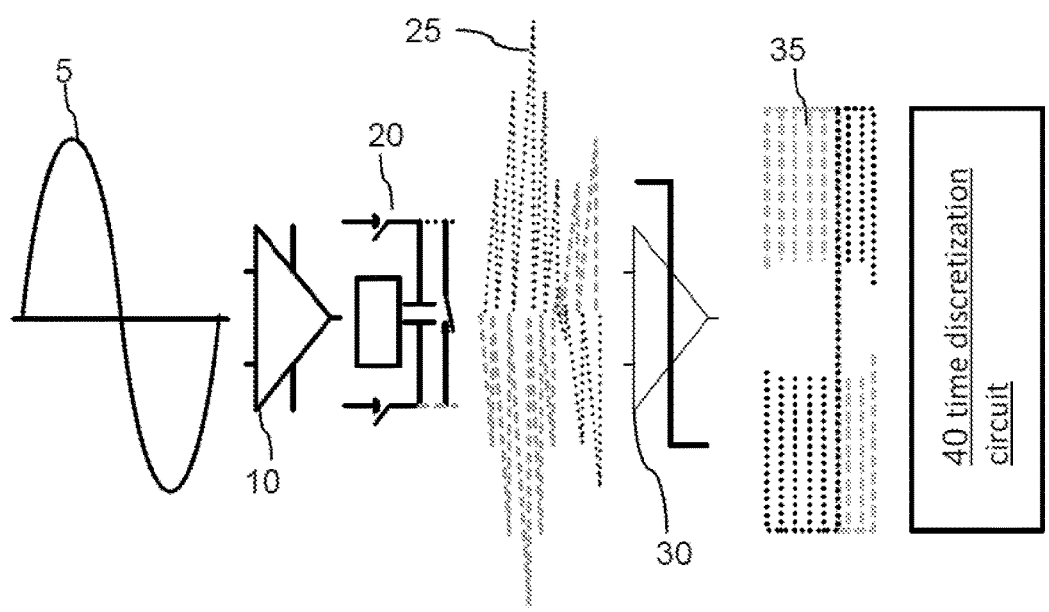
FIG. 2 shows a schematic diagram of a first analog-to-digital converter.

FIG. 2 shows a schematic diagram of a first analog-to-digital converter. The analog-to-digital converter is a 1-bit analog-to-digital converter that has a filter circuit 200 with a filter line 210. The filter line 210 has an input circuit 10 that is configured as a rectifier, whereby the rectifier encompasses an amplifier that is not negatively fed back. As a function of the input signal 5 and of a first reference signal, the rectifier relays two different first first-stage output signals to an integration circuit 20 of the filter line 210. In a simple embodiment, the integration circuit 20 has three switches and one capacitor. Two switches are switched off in such a way that the first first-stage output signal of the rectifier is relayed to the capacitor within a first half-period of the clock signal. At the end of the first half-period, these two switches are opened so that, in a second half-period of the clock signal—which follows the first half-period—no charges are relayed by the rectifier to the integration circuit 20. The capacitor can be short-circuited by means of the third switch so that the capacitor can be discharged once again in the second half-period of the clock signal. Therefore, the integration only takes place during the prescribed period of time, which is specified here by the first half-period of the clock signal. The output circuit 30 is configured as a comparator that compares the integration signal 25 emitted by the integration circuit 20 to a reference signal and then emits a first second-stage output signal 35. The first second-stage output signal 35 is relayed to a circuit for the time-discretization 40 of the filter line 210. In this example, the circuit for the time-discretization 40 is configured as a clocked flip-flop or latch. As a function of the first second-stage output signal 35 and of the interval prescribed by the clock signal, the clocked flip-flop emits a time-discrete output signal 45. In the cited example, the time-discrete output signal 45 can take on the value of 0 or 1, whereby 1 is associated with a first specific range of the amplitude of the input signal 5 (for example, positive half-wave) and 0 is associated with a second specific range of the amplitude of the input signal 5 (for example, negative half-wave). Therefore, the input signal 5 is converted into a 1-bit binary signal by means of the one filter line 210 of the filter circuit 200.

Figure 3:
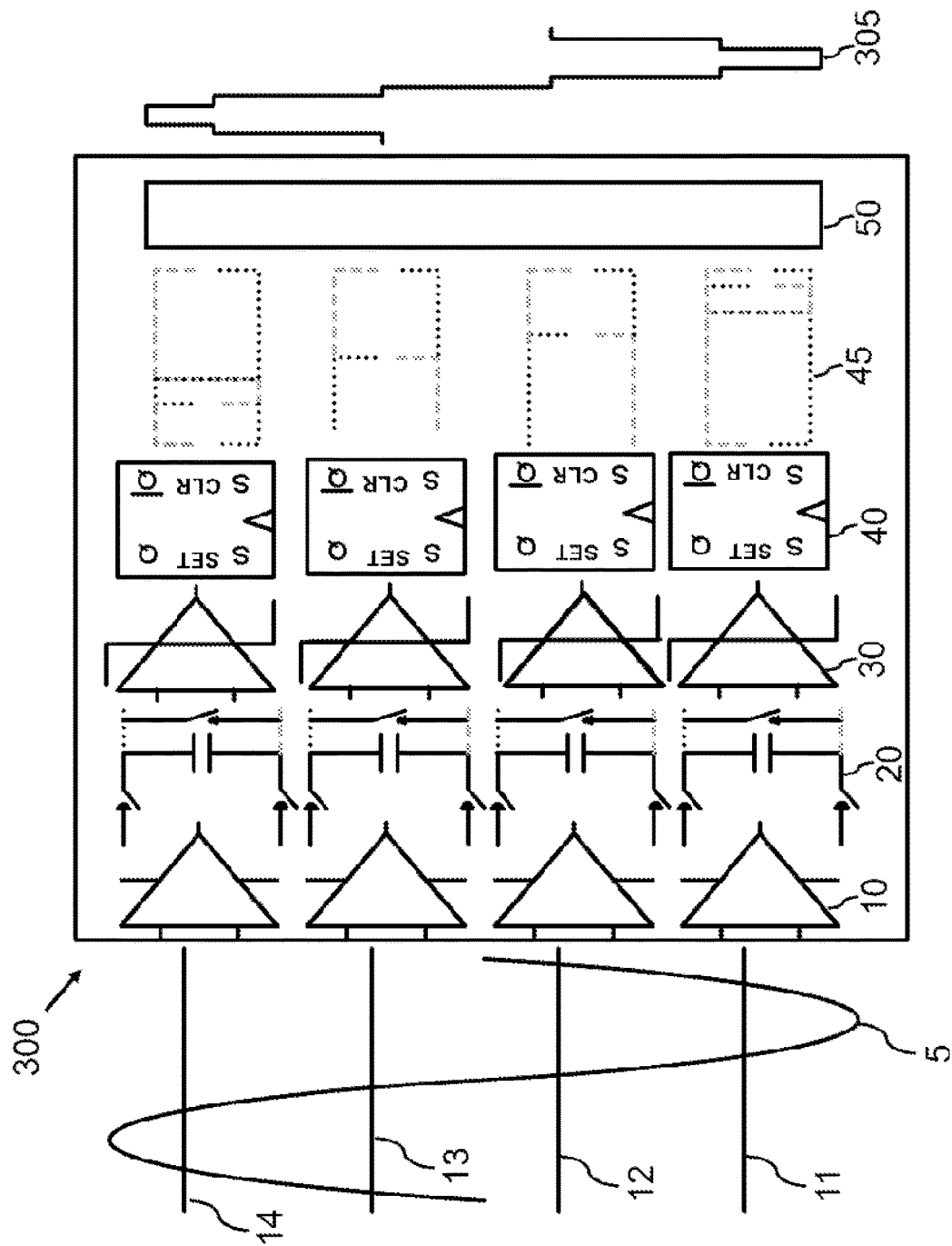
FIG. 3 shows a schematic diagram of a second analog-to-digital converter.

FIG. 3 shows a schematic diagram of a second analog-to-digital converter. The analog-to-digital converter has a filter circuit 200 with four filter lines 210. Input reference values 11, 12, 13 and 14 are associated with each of these filter lines 210, and these reference values allow the input signal 5 to be referenced with respect to four different input reference values 11, 12, 13 and 14. Therefore, the input signal 5 is divided into five different ranges. The input signal 5 is sent in parallel to all of the filter lines 210, whereby the input circuits 10 relay a first first-stage output signal to the appertaining integration circuit 20 as a function of the appertaining input reference value 11, 12, 13 or 14. The integration circuits 20 then relay the appertaining integration signal 25 to the output circuit 30 belonging to the appertaining filter line 210. The output circuits 30 generate a first, second, third and fourth second-stage output signal that, for purposes of the time-discretization 40, is relayed to the circuit belonging to the appertaining filter line. Each of the circuits for the time-discretization 40 emits a time-discrete output signal 45. Depending on the amplitude of the input signal 5 during the prescribed period of time and on the input reference values 11, 12, 13 or 14, each of the circuits emits either the value of 0 or of 1 for the time-discretization 40 with the appertaining interval of the clock signal. If, for instance, rising voltage values (−7.5V; −2.5V; 2.5V; 7.5V) are associated with the input reference values 11, 12, 13 or 14, the time-discrete output signals yield a thermometer code (0000, 0001, 0011, 0111, 1111) that can be transformed into a time-discrete binary output signal 305 by means of a transformation unit 50. The transformation unit 50 could assign, for example, a binary number (0000→000, 0001→001, 0011→010, 0111→011, 1111→100) to the appertaining thermometer code by means of a simple assignment table.

Figure 4:
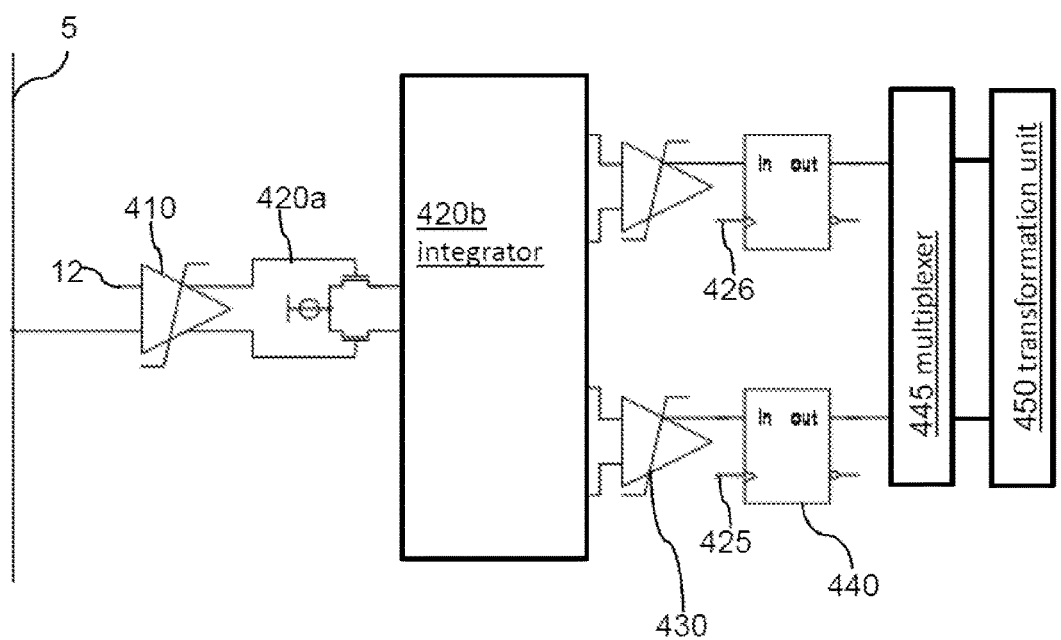
FIG. 4 shows a schematic diagram of a line of a third analog-to-digital converter.
Figure 5:
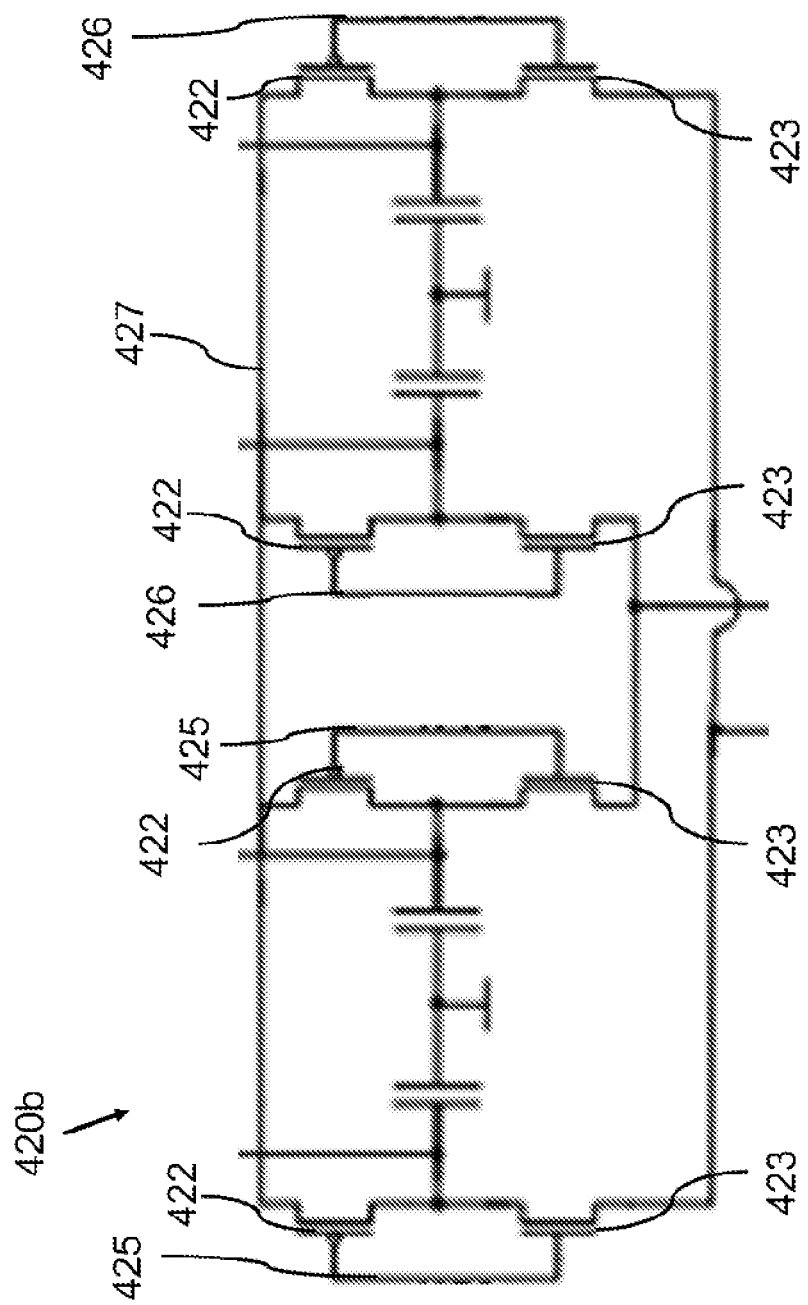
FIG. 5 shows a schematic diagram of an integrator of an integration circuit.

FIG. 4 shows a schematic diagram of a second line of a third analog-to-digital converter. The second line constitutes a possible concrete implementation of the second line of the analog-to-digital converter shown in FIG. 3. The input circuit 10 is configured concretely as an input comparator 410 that compares the input signal 5 to the input reference value 12. The first first-stage output signal of the input comparator 410 is relayed to a differential stage 420a which, like the integrator 420b, is part of the integration circuit 20. The differential stage 420a converts the voltage signal of the input comparator 410 into a current signal that can be integrated by the integrator 420b shown in FIG. 5. The integrator 420b has two branches, whereby each branch comprises two capacitors. Here, one branch is charged during the half-period of the clock signal in which the clock signal is high 425. The other branch is charged during the half-period in which the clock signal is low 426. This is done by means of the arrangement of self-locking transistors 422 and self-conducting transistors 423 which are shown in FIG. 5 and which either charge or discharge the capacitors of the first or second branch as a function of the clock signal (high or low). The charge to the capacitors is determined by means of two output comparators 430 that are encompassed by the output circuit 30. In this context, an output comparator 430 is associated with the first branch and another one is associated with the second branch of the integrator 420b. The outputs of the two output comparators 430, in turn, are relayed to an appertaining input of an associated circuit for the time-discretization 440. The output of the output comparator 430 (lower part in FIG. 4 or right-hand part in FIG. 5) associated with the first branch of the integrator 420b is thus relayed to an input of a first clocked flip-flop. The first clocked flip-flop is clocked by the clock signal low 426. The output of the output comparator 430 (upper part in FIG. 4 or left-hand part in FIG. 5) associated with the second branch of the integrator 420b is thus relayed to an input of a second clocked flip-flop. The second clocked flip-flop is clocked by the clock signal high 426. The two branches of the integrator 420b in combination with the two output comparators 430 of the output circuit 30 and the correspondingly associated clocked flip-flops of the circuit for the time-discretization 440 make it possible to convert the input signal 5 during both half-periods of the clock signal into—in this case—second (second filter line with input reference values 12) time-discrete output signals 45. A multiplexer 445 is then employed to combine time-discrete output signals 45 of the two branches to form a second time-discrete output signal and then to relay it to a transformation unit 450 together with the first, third and fourth time-discrete output signals. As elaborated upon above, the transformation unit 450 converts the thermometer code into a time-discrete binary output signal 305. In an alternative embodiment, the multiplexer 445 can also be installed downstream from the transformation unit 450 so that the time-discrete output signals of the two branches of the appertaining line (or filter line 210) are first digitized by means of the transformation unit 450 and only subsequently combined by the multiplexer 445 to form a time-discrete binary output signal 305. The number of filter lines 210 or lines of the analog-to-digital converter is selected as a function of which resolution is supposed to make the time-discrete binary output signal 305 in relation to the input signal 5 possible.

Figure 6:
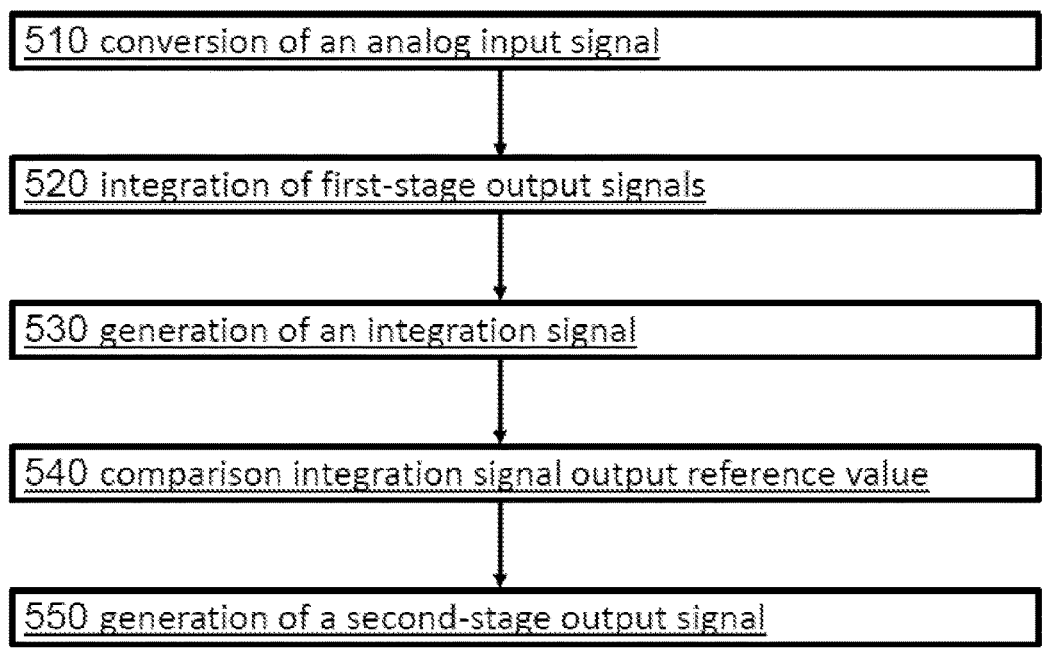
FIG. 6 shows a schematic diagram of a method for filtering signals.

FIG. 6 shows a schematic diagram of a method for filtering signals. In step 510, an analog input signal 5 is converted into at least two distinguishable first first-stage output signals as a function of the value of the input signal 5. In step 520, the first-stage output signal(s) are/is integrated over a prescribed period of time. In step 530, a first integration signal 25 is generated on the basis of the result of the integration. In step 540, the first integration signal 25 is compared to a first output reference value or output reference signal. In step 550, a first second-stage output signal 35 is generated on the basis of the result of the comparison in step 540.

It is an idea of the present invention to integrate an input signal 5 over a prescribed period of time and then to convert the result of the integration into a time-discrete output signal 45. The time-discrete output signal 45, in turn, can be converted into a time-discrete binary output signal 305. In this manner, it is possible to reduce the influence that fluctuations or interferences that are of a higher frequency in comparison to the prescribed period of time could have on the digitization of analog input signals 5, since the digitization of the input signal is no longer dependent on a momentary value of the input signal 5.

An appropriately adapted filter circuit can be employed, for example, in an analog-to-digital converter (ADC). The ADC functions in three stages:

1) value discretization: the input signal is continuously digitized by means of, for instance, n−1 amplifiers (rectifiers) for n bits. The output signal of the amplifier corresponds to the mathematical sign of the input signal minus the appertaining reference value. This yields a continuous thermometer code of the input signal downstream from the amplifiers.
2) periodic integration: each bit of the thermometer code is integrated on its own over a half-period of a clock signal. The output signal of the integration circuit is the mathematical sign indicating whether the appertaining bit of the thermometer code during the half-period was more frequently −1 or +1.
3) time discretization: at the end of the half-period, a clocked amplifier detects whether the output signal of the integration circuit at the end of the integration period of time is −1 or +1.
4) conversion: after the detection of the thermometer code, the time-discretized output signal is converted into binary code.

Other variants of the invention and their execution can be gleaned by the person skilled in the art from the preceding disclosure, from the figures and from the patent claims.

In the patent claims, used terms such as "encompass", "comprise", "contain", "have" and the like do not exclude additional elements or steps. The use of the indefinite article does not preclude the plural. Each individual device can execute the functions of several of the units or devices cited in the patent claims. The reference numerals indicated in the patent claims are not to be construed as a limitation of the means and steps employed.

LIST OF REFERENCE NUMERALS

5 input signal
10 input circuit
11, 12, 13, 14 input reference value
20 integration circuit
25 integration signal
30 output circuit
35 second-stage output signal
40, 440 circuit for the time discretization
45 time-discrete output signal
50, 450 transformation unit
200 filter circuit
210 filter line
300 analog-to-digital converter
305 time-discrete binary output signal
410 input comparator
420a differential stage
420b integrator
422 self-locking transistor
423 self-conducting transistor
425 clock high
426 clock low
427 supply voltage
430 output comparator
445 multiplexer
510 conversion of an analog input signal
520 integration of first-stage output signals
530 generation of an integration signal 540 comparison of the integration signal to the output reference value
550 generation of a second-stage output signal

The invention claimed is:

1. A filter circuit comprising at least a first filter line, wherein the first filter line has a first input circuit, a first integration circuit and a first output circuit, wherein the first filter line has a first input reference value, wherein the first input circuit is configured in such a way that, as a function of the value of the input signal, it converts an input signal into at least two distinguishable, first first-stage output signals, wherein the input signal is compared to the first input reference value in order to determine the first first-stage output signals, wherein the first first-stage output signals correspond to a mathematical sign of the input signal minus the first input reference value, wherein the first input circuit is also configured to relay the first-stage output signals to the first integration circuit during a prescribed period of time, wherein the first integration circuit is configured to integrate the first first-stage output signals of the first input circuit over the prescribed period of time and to generate a first integration signal, and wherein the first output circuit is configured to compare the first integration signal to a first output reference value and to generate a first second-stage output signal.

2. The filter circuit according to claim 1, wherein the first input circuit comprises at least an input comparator and the first output circuit comprises at least an output comparator.

3. The filter circuit according to claim 1, wherein the first integration circuit has at least a first capacitor and first switches, wherein the first capacitor and the first switches are configured so that, over the prescribed period of time, they accumulate electric charges that are associated with the first first-stage output signals.

4. The filter circuit according to claim 1, wherein the prescribed period of time is prescribed by a first regular time signal.

5. The filter circuit according to claim 1, wherein the first filter line has a first circuit for the time discretization, and the first circuit for the time discretization is configured to process the first second-stage output signal and to convert it into a time-discrete output signal.

6. The filter circuit according to claim 5, wherein the first circuit for the time discretization is configured to convert the first second-stage output signal into a time-discrete output signal as a function of the first regular time signal.

7. The filter circuit according to claim 1, wherein filter circuit comprises at least a second filter line, wherein a first range of the input signal is associated with the first filter line, and a second range section of the input signal is associated with the second filter line, wherein the first range of the input signal differs from the second range of the input signal.

8. The filter circuit according to claim 7, also comprising at least a third filter line, wherein a third range of the input signal is associated with the third filter line, wherein the second range of the input signal adjoins the first range of the input signal, and the third range of the input signal adjoins the second range of the input signal.

9. The filter circuit according to claim 8, wherein the second filter line has a second input reference value and the third filter line has a third input reference value, wherein the first range is associated by means of the first input reference value, the second range is associated by means of the second input reference value and the third range is associated by means of the third input reference value.

10. The filter circuit according to either claim 7, wherein a thermometer code is generated by means of the first second-stage output signal, by means of a second second-stage output signal generated by the second filter line, and by means of a third second-stage output signal generated by the third filter line.

11. An analog-to-digital converter comprising a filter circuit according to claim 10 and a transformation unit, wherein the transformation unit is configured to convert the time-discrete thermometer code into a time-discrete binary output signal.

12. A method for filtering signals, encompassing the following steps comprising:
as a function of the value of an input signal, converting the input signal into at least two distinguishable first first-stage output signals, wherein the input signal is compared to the first input reference value in order to determine the first first-stage output signals, wherein the first first-stage output signals correspond to a mathematical sign of the input signal minus the first input reference value;
integrating the first first-stage output signals over a prescribed period of time to generate a first integration signal; and
comparing the first integration signal to a first output reference value to generate a first second-stage output signal on the basis of the result of the comparison.

* * * * *